United States Patent [19]
Livengood et al.

[11] Patent Number: 5,976,980
[45] Date of Patent: Nov. 2, 1999

[54] METHOD AND APPARATUS PROVIDING A MECHANICAL PROBE STRUCTURE IN AN INTEGRATED CIRCUIT DIE

[75] Inventors: Richard H. Livengood, Los Gatos; Paul Winer, Santa Clara; Valluri R. M. Rao, Saratoga, all of Calif.

[73] Assignee: Intel Corporation, Santa Clara, Calif.

[21] Appl. No.: 08/941,887

[22] Filed: Sep. 30, 1997

Related U.S. Application Data

[63] Continuation-in-part of application No. 08/724,223, Oct. 2, 1996, application No. 08/771,273, Dec. 20, 1996, and application No. 08/771,712, Dec. 20, 1996, said application No. 08/724,223, is a continuation of application No. 08/344,149, Nov. 23, 1994, abandoned.

[51] Int. Cl.$^6$ .................................................. H01L 21/00
[52] U.S. Cl. .............................. 438/691; 438/8; 438/694; 438/735; 216/61
[58] Field of Search .............................. 438/8, 9, 14, 18, 438/691–692, 694, 733, 735, 745; 216/84, 59, 86, 61, 88; 156/345 LC

[56] References Cited

U.S. PATENT DOCUMENTS

| | | |
|---|---|---|
| 4,632,724 | 12/1986 | Chesebro et al. ..................... 156/626.1 |
| 4,650,744 | 3/1987 | Amano ................................. 156/626.1 |
| 4,732,646 | 3/1988 | Elsner et al. ......................... 156/626.1 |
| 5,037,771 | 8/1991 | Lipp . |
| 5,064,498 | 11/1991 | Miller ................................... 156/626.1 |
| 5,268,065 | 12/1993 | Grupen-Shemansky ............. 156/626.1 |
| 5,438,166 | 8/1995 | Carey et al. . |
| 5,701,666 | 12/1997 | DeHaven et al. . |
| 5,838,625 | 11/1998 | Cutter et al. . |
| 5,840,627 | 11/1998 | Huggins . |
| 5,843,844 | 12/1998 | Miyanaga .............................. 216/86 X |
| 5,844,295 | 12/1998 | Tsukude et al. . |

FOREIGN PATENT DOCUMENTS

| | | | |
|---|---|---|---|
| 0 295 065 | 12/1988 | European Pat. Off. ............ | 156/627.1 |
| 56-46534 | 4/1981 | Japan .................................. | 156/626.1 |
| 59-44827 | 3/1984 | Japan .................................. | 156/626.1 |
| 1-119037 | 5/1989 | Japan .................................. | 156/627.1 |

OTHER PUBLICATIONS

Paul Winer, "IC Failure Analysis, E–Beam Tutorial," International Reliability and Physics Symposium, 1996.

Scott Silverman, "Laser Microchemical Technology Enables Real–Time Editing of First–Run Silicon," Solid State Technology, 1996.

Ann N. Campbell, Fault Localization with the Focused Ion Beam (FIB) System, in Microelectronic Failure Analysis, ASM International, 1996.

*Primary Examiner*—William Powell
*Attorney, Agent, or Firm*—Blakely, Sokoloff, Taylor & Zafman

[57] ABSTRACT

A method and an apparatus providing a mechanical probe structure through the back side of an integrated circuit die. In one embodiment, semiconductor substrate is thinned from the back side of the integrated circuit die above a probe target. The probe target is then exposed and a thin insulating layer is formed over the exposed probe target and the nearby semiconductor substrate. The thin insulating layer provides electrical isolation between the exposed probe target and the bulk semiconductor substrate. The thin insulating layer also provides a base insulating platform for a probe pad that is subsequently deposited. After the insulating layer is formed over the exposed probe target and the nearby semiconductor substrate, the probe target is re-exposed through insulating layer such that a probe pad may be deposited over the probe target to provide electrical contact to the original probe target as well as provide a probe pad for mechanical probing purposes from the back side of the integrated circuit die.

23 Claims, 9 Drawing Sheets

METHOD AND APPARATUS PROVIDING A MECHANICAL PROBE STRUCTURE IN AN INTEGRATED CIRCUIT DIE

RELATED APPLICATIONS

This application is a continuation-in-part of application Ser. No. 08/724,223, filed Oct. 2, 1996, entitled "A Method of Accessing the Circuitry on a Semiconductor Substrate from the Bottom of the Semiconductor Substrate," and assigned to the Assignee of the present application, which is a continuation of application Ser. No. 08/344,149, filed Nov. 23, 1994, now abandoned.

This application is also a continuation-in-part of application Ser. No. 08/771,273, filed Dec. 20, 1996, entitled "Method and Apparatus for Editing an Integrated Circuit," and assigned to the Assignee of the present application.

This application is also a continuation-in-part of co-pending application Ser. No. 08/771,712, filed Dec. 20, 1996, entitled "Method and Apparatus for Endpointing While Milling an Integrated Circuit," and assigned to the Assignee of the present application.

This application is also related to application Ser. No. 08/940,888, filed Sep. 30, 1997, entitled "Method and Apparatus For Probing An Integrated Circuit Through the Back Side of an Integrated Circuit Die," and assigned to the Assignee of the present application.

This application is also related to application Ser. No. 08/940,830, filed Sep. 30, 1997, entitled "Method and Apparatus Providing a Circuit Edit Structure Through the Back Side of an Integrated Circuit Die," and assigned to the Assignee of the present application.

This application is also related to application Ser. No. 08/940,624, filed Sep. 30, 1997, entitled "Method and Apparatus For Performing A Circuit Edit Through the Back Side of an Integrated Circuit Die," and assigned to the Assignee of the present application.

FIELD OF THE INVENTION

The present invention relates generally to the field of integrated circuit testing and, more particularly, to a method and an apparatus for probing an integrated circuit.

BACKGROUND INFORMATION

Once a newly designed integrated circuit has been formed on a semiconductor substrate, the integrated circuit must be thoroughly tested to ensure that the circuit performs as designed. Portions of the integrated circuit that do not function properly are identified so that they can be corrected by modifying the design of the integrated circuit. This process of testing an integrated circuit to identify problems with its design is known as debugging. After debugging the integrated circuit and correcting any problems with its design, the final fully functional integrated circuit designs are used to mass produce the integrated circuits in a manufacturing environment for consumer use.

During the debugging process, it is sometimes necessary to probe certain internal electrical nodes in the integrated circuit in order to obtain important electrical data from the integrated circuit, such as for example voltage levels, timing information, current levels, thermal information or the like. The typical integrated circuit device contains multiple layers of metal interconnects. The metal interconnects in the first layer of an integrated circuit device generally carry the most valuable electrical data for debugging purposes. Metal interconnect lines in the first metal layer reside closest to the semiconductor substrate and are usually directly coupled to important components of the integrated circuit device such as for example transistors, resistors and capacitors. It is the electrical data received, manipulated and transmitted by these components that a designer is most interested in analyzing during the debugging process.

FIG. 1A is an illustration of an integrated circuit package 101 that includes wire bonds 103 disposed along the periphery of integrated circuit die 105 to electrically connect integrated circuit connections through metal interconnects 113 to pins 107 of package substrate 111. As shown in FIG. 1A, metal interconnects 113 are coupled to diffusion regions 117 through metal contacts 109. In some instances, diffusion regions 117 may be used in integrated circuit devices such as transistors, resistors, capacitors or the like. As shown in FIG. 1A, a probe tool 115 may be used to probe metal interconnect 113 through the top side 119 of integrated circuit die 105 to obtain the electrical data from integrated circuit die 105.

In some instances, probe tool 115 may be a mechanical probe tool that is used to directly probe a signal of interest from integrated circuit package 101. A mechanical probe is commonly used to directly probe important signals of interest that have been routed to a layer of metal interconnects 113 near the front side 119 of the integrated circuit die 105. When using a mechanical probe tool 115 to probe signals, the mechanical probe tool is placed in direct physical contact with the metal interconnect 113 carrying the signal of interest.

There are several disadvantages with the wire bond design of integrated circuit package 101 of FIG. 1A. One problem stems from the fact that as the density and complexity of integrated circuit die 105 increases, so must the number of wire bonds 103 required to control the functions integrated circuit die 105. However, there are only a finite number of wire bonds 103 that can fit along the periphery of integrated circuit die 105. One way to fit more wire bonds 103 along the periphery of integrated circuit die 105 is to increase the overall size of integrated circuit die 105, thereby increasing its peripheral area. Unfortunately, an increase in the overall size of integrated circuit die 105 also significantly increases the integrated circuit manufacturing costs.

Another disadvantage with integrated circuit package 101 of FIG. 1A is that the active circuitry within integrated circuit die 105 must be routed through electrical interconnects 113 to the peripheral region of integrated circuit die 105 in order to electrically couple the active circuitry to wire bonds 103. By routing these metal interconnect lines 113 over a relatively long distance across the integrated circuit die 105, the increased resistive, capacitive and inductive effects of these lengthy interconnects 113 result in an overall speed reduction of the integrated circuit. In addition, the inductance of wire bonds 103 may also severely limit high frequency operation of integrated circuit devices in integrated circuit package 101.

With continuing efforts in the integrated circuit industry to increase integrated circuit speeds as well device densities, there is a trend towards using flip-chip technology when packaging complex high speed integrated circuits. Flip-chip technology is also known as controlled collapse chip connection (C4) packaging. In flip-chip packaging technology, the integrated circuit die is flipped upside-down. This is opposite to how integrated circuits are packaged today using wire bond technology, as illustrated in FIG. 1A. By flipping the integrated circuit die upside-down, ball bonds may be used to provide direct electrical connections from the bond pads directly to the pins of a flip-chip package.

To illustrate, FIG. 1B shows a flip-chip package 151 with an integrated circuit die 155 flipped upside-down relative to the wire bonded integrated circuit die 105 of FIG. 1A. In comparison with wire bonds 103 of FIG. 1A, ball bonds 153 of flip-chip package 151 provide more direct connections between the circuitry integrated circuit die 155 and the pins 157 of package substrate 161 through metal interconnects 159. As a result, the inductance problems that plague typical wire bond integrated circuit packaging technologies are reduced. Unlike wire bond technology, which only allows bonding along the periphery of the integrated circuit die 155, flip-chip technology allows connections to be placed anywhere on the integrated circuit die surface. This results in reduced inductance power distribution to the integrated circuit, which is another major advantage of flip-chip technology.

One consequence of integrated circuit die 155 being flipped upside-down in flip-chip package 151 is that access to the internal nodes of integrated circuit die 155 for debugging purposes has become a considerable challenge. As discussed above, the present day debug process for wire bond technology is based in part on directly probing the metal interconnects through the front side of the integrated circuit die with a mechanical probe tool. However, with flip-chip packaging technology, this front side methodology is not feasible since the integrated circuit die is flipped upside-down. For example, as illustrated in FIG. 1B, access to the metal interconnects 159 for the purpose of conventional mechanical probing is obstructed by the package substrate 161. Instead, the P-N junctions forming diffusion regions 163 of the integrated circuit are accessible through the back side 165 of the semiconductor substrate of integrated circuit die 155.

In view of the foregoing, what is desired is a method and an apparatus providing a mechanical probe structure in an integrated circuit. Such a method and apparatus should allow the mechanical probing of signals through the back side of modern day flip-chip packaged integrated circuits.

SUMMARY OF THE INVENTION

A method and an apparatus providing a mechanical probe structure in an integrated circuit die is disclosed. In one embodiment, a mechanical probe structure is formed by exposing from a back side of the integrated circuit die a probe target through a substrate of the integrated circuit die. An insulating layer is then formed over the exposed substrate of the integrated circuit die proximate to the probe target and then a probe pad is deposited over the insulating layer proximate to the probe target. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

Figure 2A:
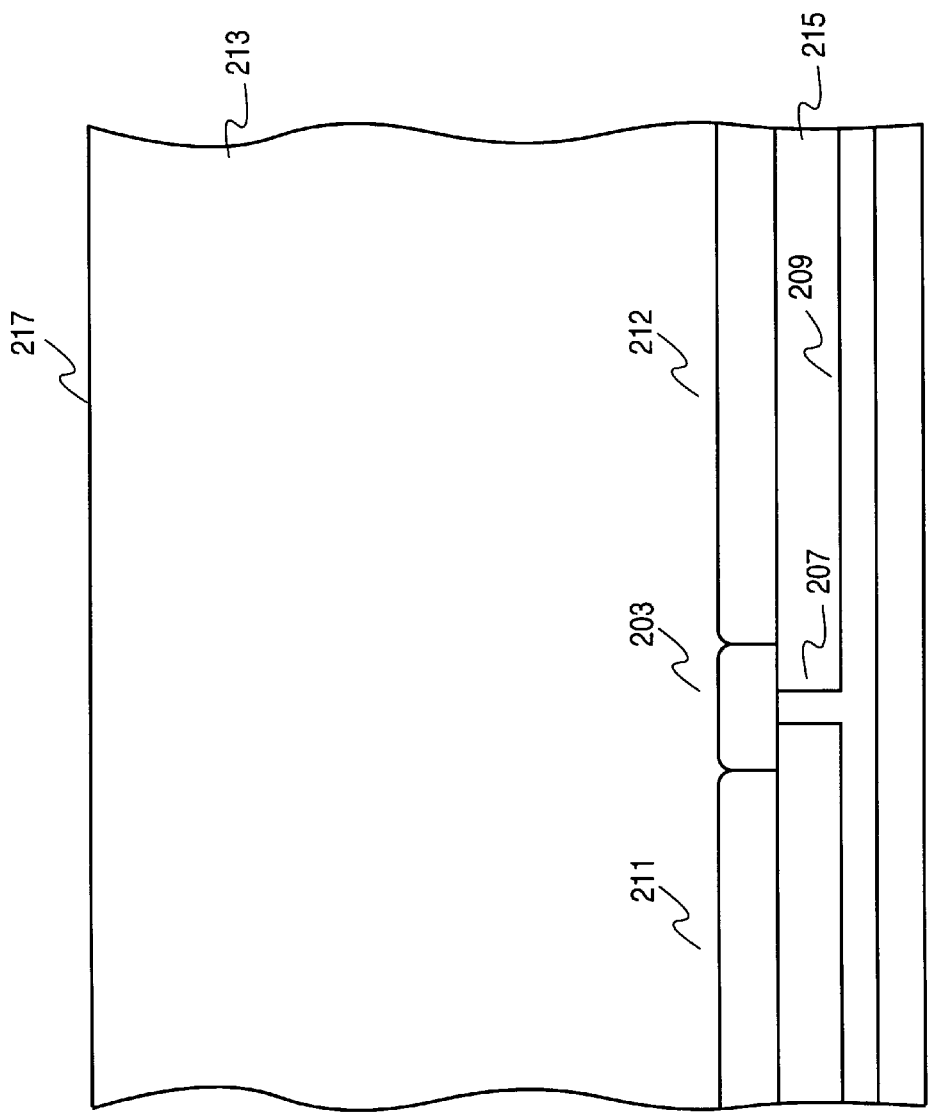
FIG. 2A is an illustration of a cross-section of a probe target disposed in a semiconductor substrate of a flip-chip packaged integrated circuit die in accordance with the teachings of the present invention.
Figure 2B:
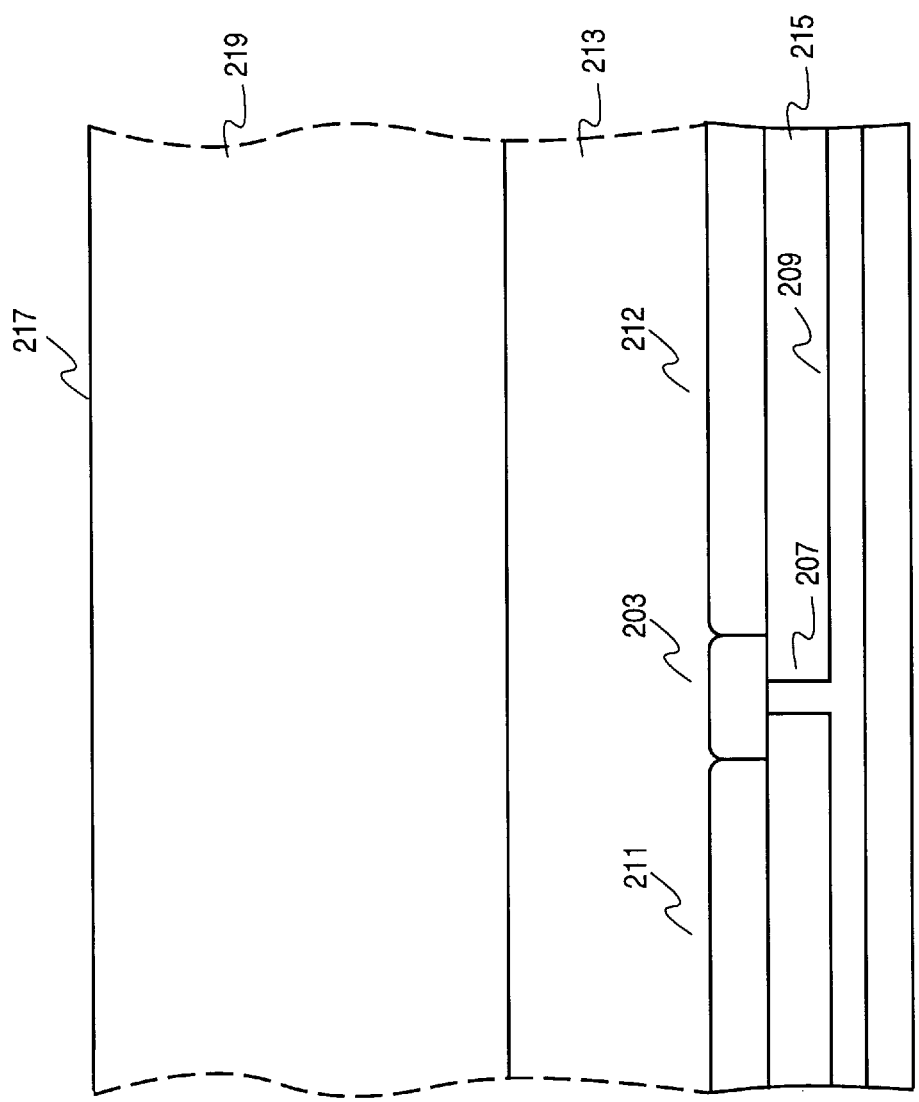
FIG. 2B is an illustration of a cross-section of the probe target in the integrated circuit die that is globally thinned and/or locally trenched from the back side of the integrated circuit die in accordance with the teachings of the present invention.
Figure 2C:
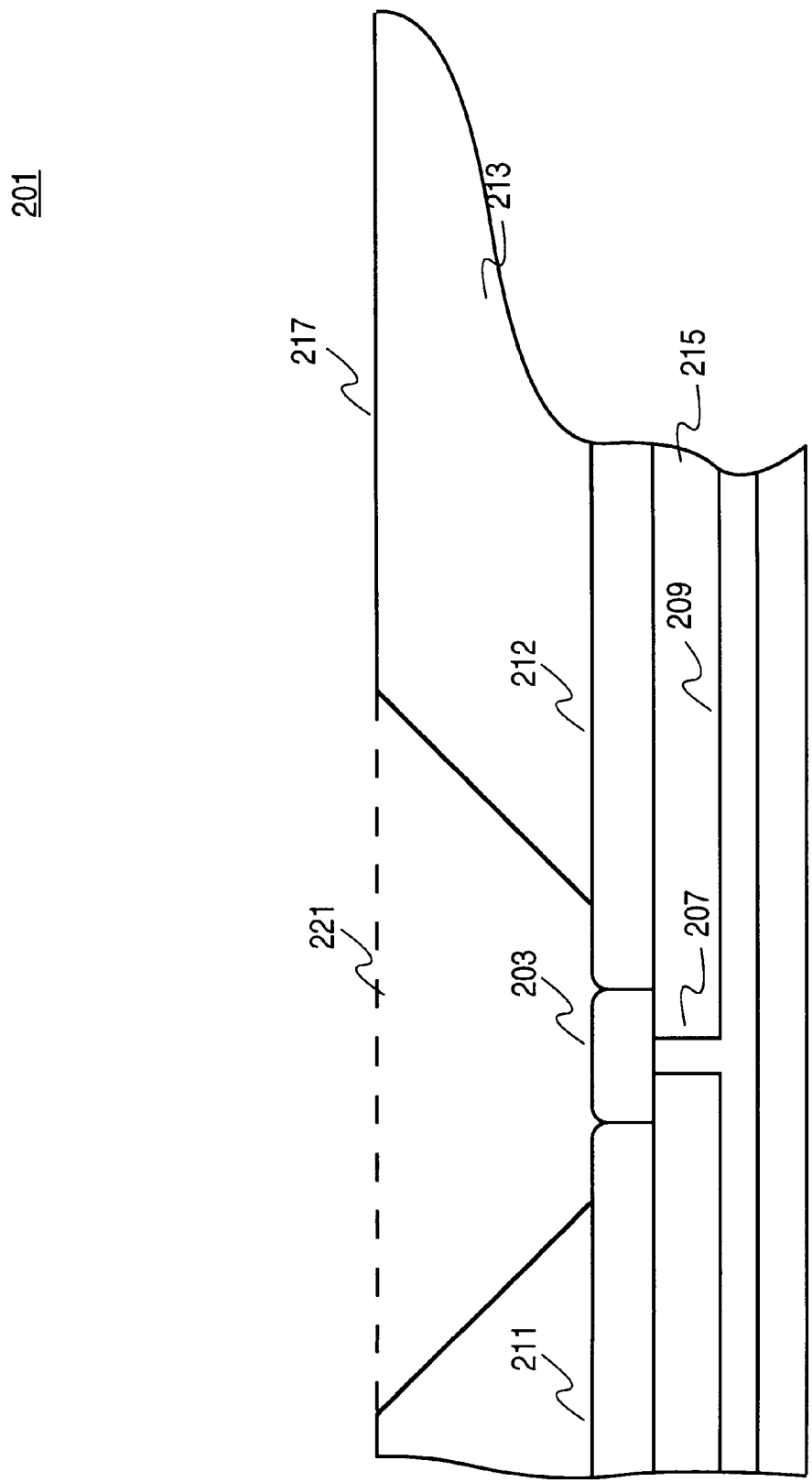
FIG. 2C is an illustration of a cross-section of the probe target in the integrated circuit die that is exposed from the back side of the integrated circuit die in accordance with the teachings of the present invention.

A method and an apparatus providing a mechanical probe structure in an integrated circuit die is disclosed. In the following description, numerous specific details are set forth in order to provide a thorough understanding of the present invention. It will be apparent, however, to one having ordinary skill in the art that the specific detail need not be employed to practice the present invention. In other instances, well known materials or methods have not been described in detail to avoid obscuring the present invention. While the diagrams representing embodiments of the present invention are illustrated in FIGS. 2A–3, these illustrations are not intended to limit the invention. The specific processes and structures described herein are only meant to help clarify an understanding of the present invention and to illustrate various embodiments of how the present invention may be implemented in order to achieve a desired result. For the purposes of this discussion, a semiconductor substrate may be a substrate including any material or material used in the manufacture of a semiconductor device.

Figure 1A:
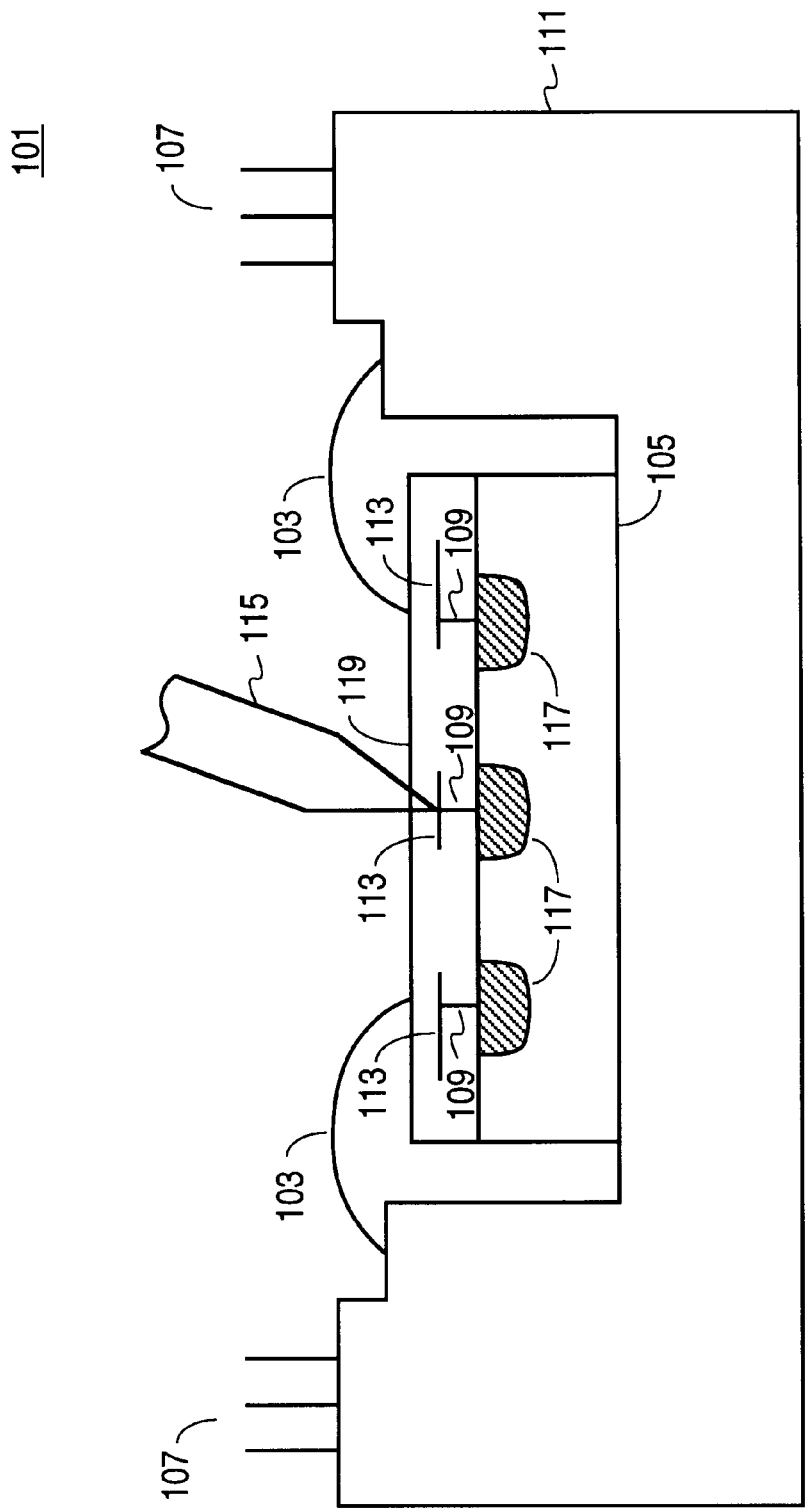
FIG. 1A is an illustration showing prior art wire bond technology.
Figure 1B:
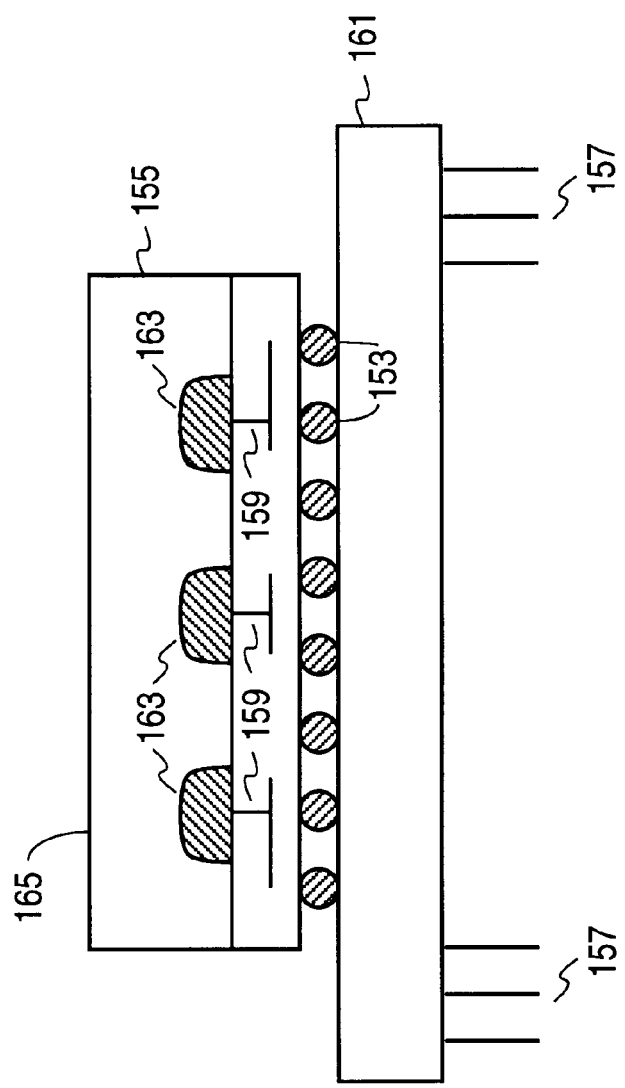
FIG. 1B is an illustration showing prior art flip-chip or C4 packaging technology.

The present invention is directed to a method and an apparatus providing a novel mechanical probe structure that enables a flip-chip packaged integrated circuit die to be mechanically probed through the back side of the integrated circuit die. As discussed earlier, the mechanical probing of signal lines through the front side of an integrated circuit die is a useful technology for debugging logic, timing, and speed path problems associated with newly developed microprocessors, micro-controllers, memory chips and the like. With the continuing migration of packaging technology from wire bond technology to flip-chip technology, as shown in FIGS. 1A and 1B respectively, it is desired to develop the ability to mechanically probe signals through the back side of a flip-chip packaged integrated circuit die. Using prior art mechanical probing techniques, direct access to the metal interconnects disposed in the dielectric isolation layer of an integrated circuit die through the front side is not available without altering the package because direct physical access to the front side of the flip-chip packaged integrated circuit die is obstructed by the package substrate.

FIG. 2A is an illustration of a cross-section of a flip-chip packaged integrated circuit die 201 having a signal line 209 disposed in a dielectric isolation layer 215 of the integrated circuit die 201. Assuming a circuit designer wishes to mechanically probe a signal on signal line 209, the circuit designer may access signal line 209 according to the following steps.

In one embodiment, signal line 209 is made of a conductive material, such as metal, polysilicon or the like. In one embodiment, a passive diffusion 203 is disposed in a semiconductor substrate 213 of flip-chip packaged integrated circuit die 201. For the purposes of this disclosure, a passive diffusion may simply be interpreted as a diffusion disposed in a semiconductor substrate for providing a signal access location. In one embodiment, semiconductor substrate 213 includes silicon. Passive diffusion 203 is coupled to signal line 209 through contact 207. Passive diffusion 203 is disposed in semiconductor substrate 213 between field oxide or trench isolation oxide regions 211 and 212 as shown in FIG. 2A.

In one embodiment, passive diffusion 203 is considered a probe target and is accessed through back side 217 of flip-chip packaged integrated circuit die 201. In another embodiment, it is appreciated that signal line 209 may be accessed directly through back side 217 as a probe target. It is noted that other structures in the integrated circuit die may be used as potential probe targets, some of which are described in co-pending application Ser. No. 08/941,888, filed Sep. 30, 1997, entitled "Method and Apparatus for Probing and Integrated Circuit through the Back Side of an Integrated Circuit Die," and assigned to the Assignee of the present invention. Co-pending application Ser. No. 08/940,830, filed Sep. 30, 1997, entitled "Method and Apparatus Providing a Circuit Edit Structure through the Back Side of an Integrated Circuit Die," which is assigned to the Assignee of the present invention, also describes a circuit edit structure that may be probed in accordance with the teachings of the present invention. In general it is appreciated that any conductor in the integrated circuit die carrying a signal may be considered a probe target in accordance with the teachings of the present invention. Possible probe targets include, but are not limited to, metal, polysilicon, diffusion and well taps.

When providing a mechanical probe structure to mechanically probe signal line 209 in accordance with the teachings of the present invention, flip-chip packaged integrated circuit die is first thinned in the region above passive diffusion 203 in one embodiment. This aspect of the present invention is illustrated in FIG. 2B with back side portion 219 of semiconductor substrate 213 being removed above passive diffusion 203 from back side 217. In one embodiment, integrated circuit die 201 is globally thinned to a thickness of approximately 200 microns using well known techniques such as for example but not limited to mechanical polishing, mechanical machining, chemical etching, or the like. In another embodiment, integrated circuit die 201 may be locally trenched in the region proximate to passive diffusion 203 to remove back side portion 219 using well known techniques. In yet another embodiment, integrated circuit die 201 is thinned using a combination of well known global and local thinning techniques.

It is noted that other useful techniques for thinning the flip-chip packaged integrated circuit die for access to structures in the integrated circuit through the back side are described in co-pending application Ser. No. 08/724,223, filed Oct. 2, 1996, entitled "A Method of Accessing the Circuitry on a Semiconductor Substrate From the Bottom of the Semiconductor Substrate," and assigned to the Assignee of the present application, which is a continuation application of Ser. No. 08/344,149, filed Nov. 23, 1994, now abandoned.

After the thinning step shown in FIG. 2B, a portion 221 of semiconductor substrate 213 above passive diffusion 203 is milled away to expose passive diffusion 203 from back side 217 of integrated circuit die 201. This aspect of the present invention is illustrated in FIG. 2C. In one embodiment, passive diffusion 203 is exposed using well known milling techniques, such as for example a focused ion beam (FIB) milling tool. It is noted that useful techniques for endpointing while milling an integrated circuit are described in co-pending application Ser. No. 08/771,712, filed Dec. 20, 1996, entitled "Method and Apparatus for Providing Endpointing While Milling an Integrated Circuit," and assigned to the Assignee of the present application.

In another embodiment, back side portion 221 is milled away from back side 217 such that signal line 209 is directly exposed through dielectric isolation layer 215 and semiconductor substrate 213. In this embodiment, signal line 209 may be considered the probe target and passive diffusion 203 is therefore not used to provide mechanical probe access to signal line 209. This embodiment is illustrated in greater detail below in FIG. 2F.

Referring back to the embodiment illustrated in FIG. 2C, once passive diffusion 203 has been exposed, an insulating layer 223 is formed over and proximate to the exposed areas of passive diffusion 203 and semiconductor substrate 213 from the back side 217 of flip-chip packaged integrated circuit die 201. In one embodiment, insulating layer 223 serves to provide electrical isolation between the probe target, passive diffusion 203, and the exposed semiconductor substrate 213. In one embodiment, insulating layer 223 is a thin layer of dielectric and provides an insulating platform that will be used to electrically isolate a mechanical probe pad, which will be deposited in subsequent steps, from semiconductor substrate 213.

In one embodiment, insulating layer 223 is locally formed over passive diffusion 203 and the exposed areas of semiconductor substrate 213 proximate to passive diffusion 203 with a FIB induced dielectric chemical vapor deposition (CVD) system. In another embodiment, insulating layer 223 may be formed using other local techniques such as for example but not limited to laser induced CVD, electron beam induced CVD, and laser induced silicon oxide growth. In yet another embodiment, insulating layer 223 is globally formed over the back side 217 of integrated circuit die 201 using well known techniques including but not limited to plasma enhanced chemical vapor deposition (PECVD), a dielectric film evaporator, sputtering deposition, thermal growth or the like. It is noted that other helpful techniques for depositing an insulating layer are described in co-pending application Ser. No. 08/940,624, filed Sep. 30, 1997, entitled "Method and Apparatus For Performing A Circuit Edit Through the Back Side of an Integrated Circuit Die," and assigned to the Assignee of the present application.

Figure 2D:
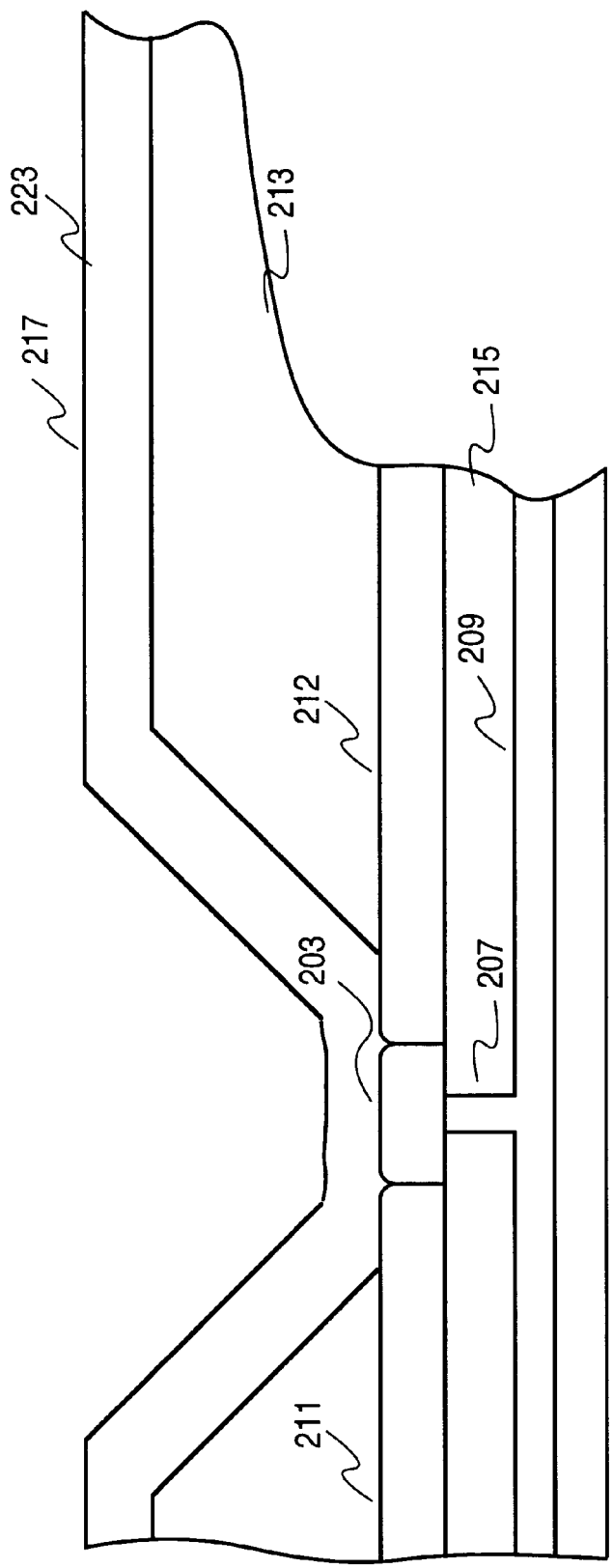
FIG. 2D is an illustration of a cross-section of the exposed probe target with an insulating layer deposited over the probe target and the exposed semiconductor substrate of the integrated circuit die proximate to the probe target.
Figure 2E:
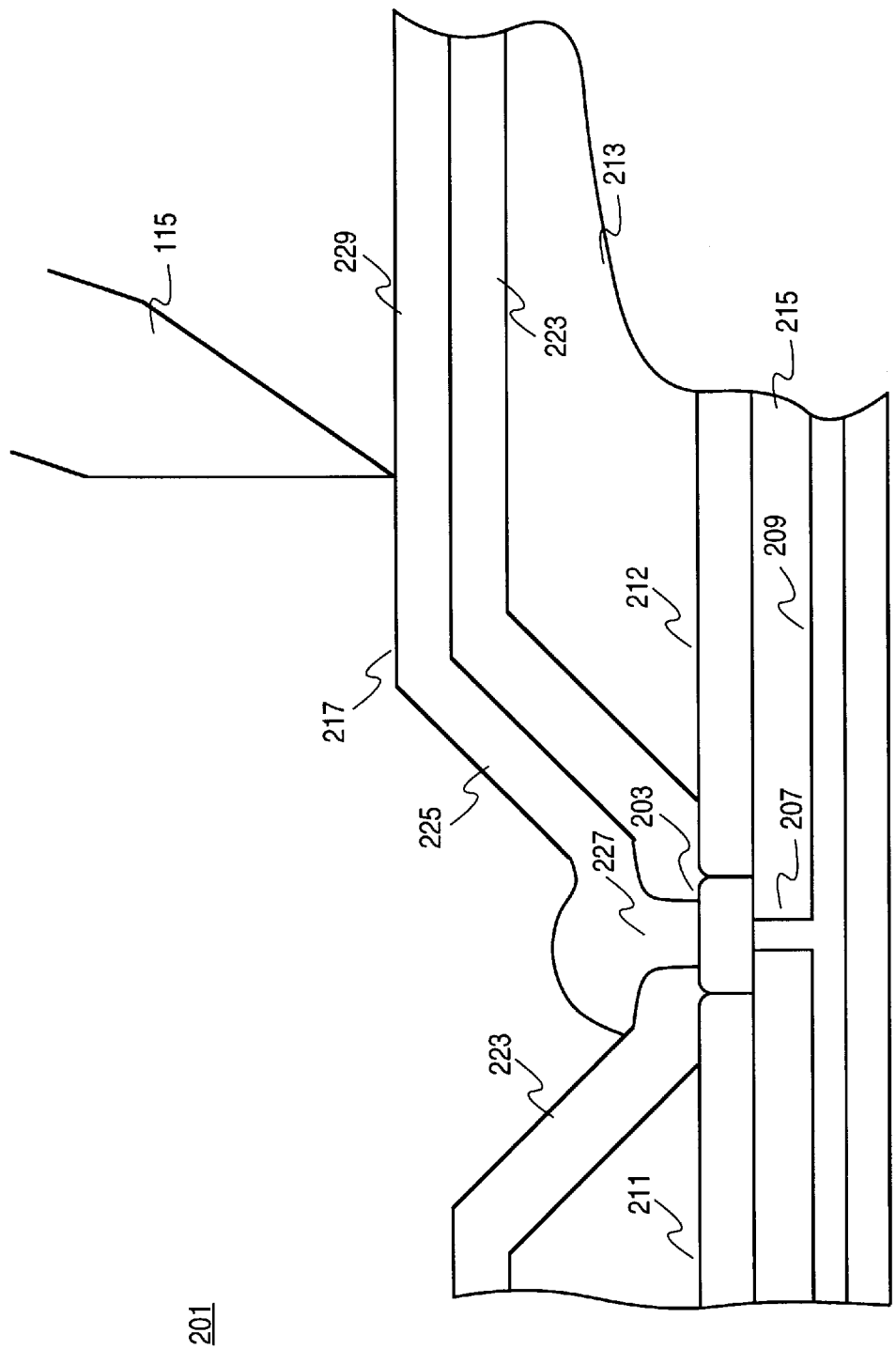
FIG. 2E is an illustration of a cross-section of a probe pad deposited over the insulating layer proximate to the probe target with the probe pad coupled to the probe target in accordance with the teachings of the present invention.
Figure 3:
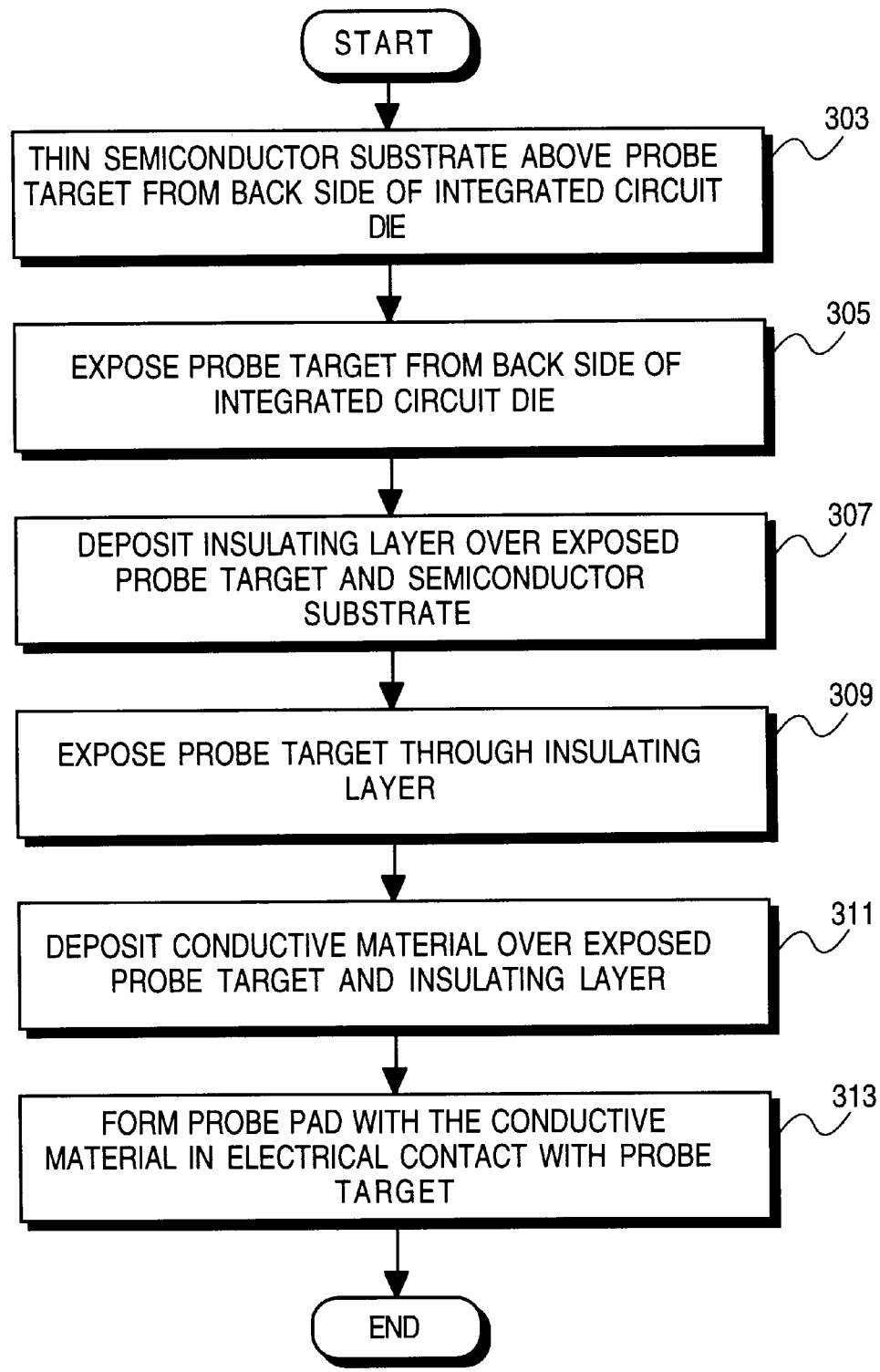
FIG. 3 is an illustration of a flow diagram showing the mechanical probe processing blocks performed in accordance with the teachings of the present invention.

After insulating layer 223 has been formed as shown in FIG. 2D, the probe target, shown as passive diffusion 203 in FIG. 2E, is re-exposed from the back side 217 of integrated circuit die 201. As shown in the embodiment illustrated in FIG. 2E, an opening 227 is milled through insulating layer 223 to re-expose passive diffusion 203. In one embodiment, opening 227 is milled using a FIB with chemical assisted etching. In another embodiment, opening 227 may be formed using other techniques such as straight FIB sputtering, laser chemical etching, laser ablation, electron beam chemical etching, or other similar techniques.

After the probe target has been re-exposed, as illustrated in the embodiment shown in FIG. 2E with passive diffusion 203 re-exposed through opening 227, a conductor 225 is deposited over insulating layer 223 from back side 217 of integrated circuit die to form a probe pad coupled to signal line 209. As illustrated in the embodiment shown in FIG. 2E, probe pad 229, which is formed with conductor 225 is coupled to signal line 209 through opening 227, passive diffusion 203 and contact 207. In one embodiment, conductor 225 is deposited using a FIB induced metal CVD, a laser metal CVD deposition tool, an electron beam deposition tool, or the like. In another embodiment, metal patterning and deposition may be achieved using well known etching, deposition and photolithography techniques.

In one embodiment, probe pad 229 is formed to have dimensions of at least five microns by five microns, which provides a adequately sized probe pad in electrical contact to the probe target for mechanical probing purposes. In one embodiment, the probe pad 229 has dimensions of ten microns by ten microns and provides a relatively large electrically isolated surface area to place a mechanical probe 115. Thus, signal line 209 may be mechanically probed with mechanical probe tool from the back side 217 of integrated circuit die in accordance with the teachings of the present invention. It is noted that other helpful techniques for depositing conductive material are also described in co-pending application Ser. No. 08/771,273, filed Dec. 20, 1996, entitled "Method and Apparatus for Editing an Integrated Circuit," and assigned to the Assignee of the present application.

Figure 2F:
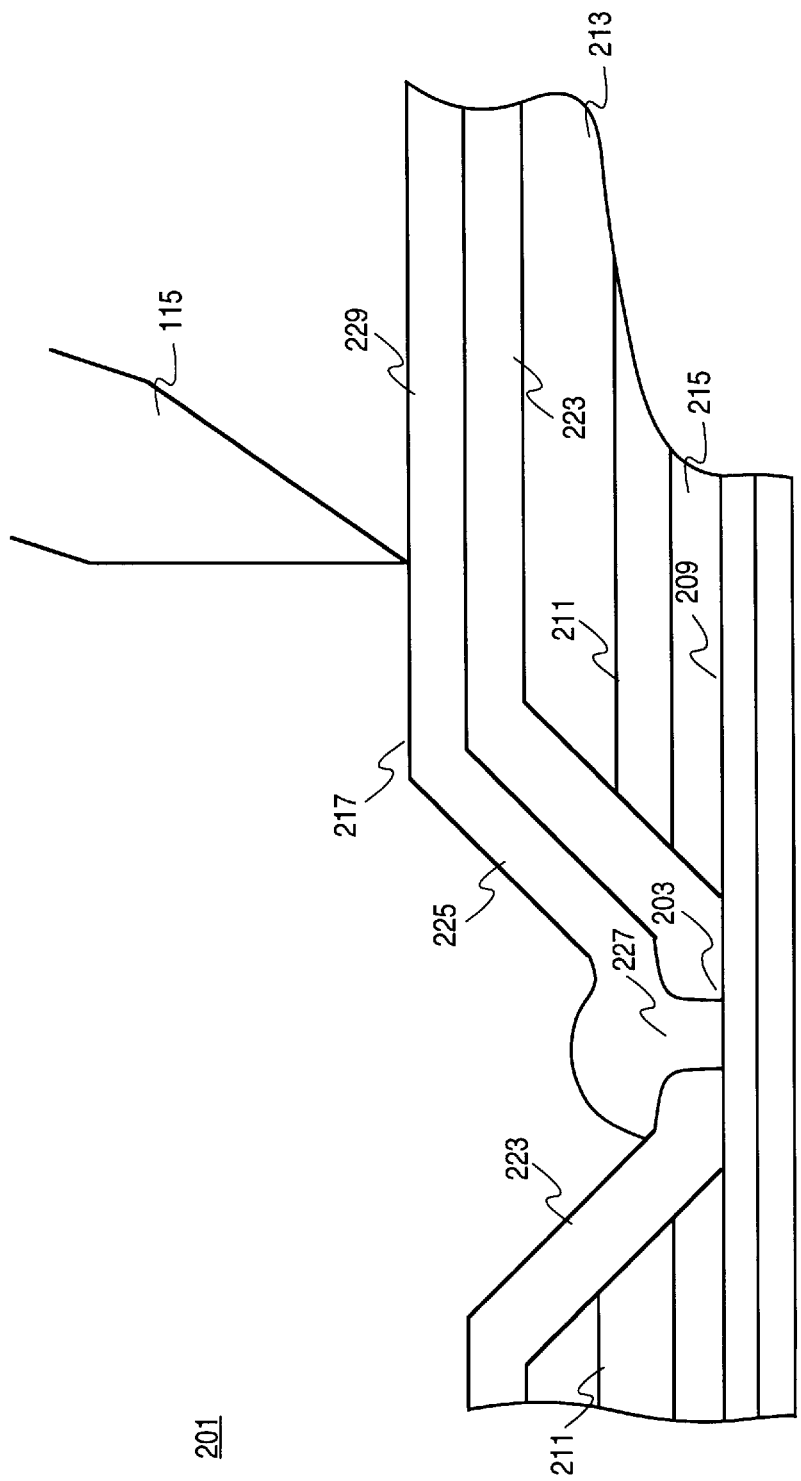
FIG. 2F is an illustration of alternate embodiment of a cross-section of a probe pad deposited over the insulating layer and directly coupled to a signal line in a dielectric isolation layer in accordance with the teachings of the present invention.

FIG. 2F is an illustration of alternate embodiment of a cross-section of a flip-chip packaged integrated circuit die 201 with a probe pad 229 in accordance with the teachings of the present invention. As shown in FIG. 2F, integrated circuit die 201 includes a signal line 209 disposed in dielectric isolation layer 215 beneath field oxide region 211. In the embodiment illustrated, signal line 209 is accessed directly from the back side 217 of integrated circuit die 201 through semiconductor substrate 213, field oxide region 211 and dielectric isolation layer 215. Using techniques similar to those discussed above in connection with FIGS. 2A–2E, integrated circuit die 201 is thinned and then signal line 209 is directly exposed from the back side 217. An insulating layer 223 is formed over exposed signal line 209 and semiconductor substrate 213 and then an opening 227 is formed in insulating layer 223 to re-expose signal line 209. Conductor 225 is then deposited over opening 227 to be in electrical contact with signal line 209. Probe pad 229 is patterned out of conductor 217 to provide a relatively large electrically isolated surface area to place mechanical probe 115.

Flow chart 301 of FIG. 3 shows mechanical probing steps performed in accordance with the teachings of the present invention. When providing a mechanical probe structure through the back side of an integrated circuit die, the semiconductor substrate above the probe target is thinned from the back side of the integrated circuit die, as shown in processing block 303. As shown in processing block 305, the probe target is then exposed from the back side of the integrated circuit die. Next, an insulating layer is formed over the exposed probe target and nearby semiconductor substrate from the back side of the semiconductor die, as shown in processing block 307. Next, the probe target is exposed through the insulating layer from the back side, as shown in processing block 309. As shown in processing blocks 311 and 313, conductive material is then deposited over the exposed probe target and a conductive probe pad is formed, which is electrically coupled to the probe target.

Thus, what has been described is a method and an apparatus providing a mechanical probe structure through the back side of a flip-chip packaged integrated circuit die. In the foregoing detailed description, the method and apparatus of the present invention has been described with reference to specific exemplary embodiments thereof. It will, however, be evident that various modifications and changes may be made thereto without departing from the broader spirit and scope of the present invention. The present specification and Figures are accordingly to be regarded as illustrative rather than restrictive.

What is claimed is:

1. A method of providing a mechanical probe structure in an integrated circuit die, the method comprising the steps of:
    exposing from a back side of the integrated circuit die a probe target through a substrate of the integrated circuit die;
    forming an insulating layer over the exposed substrate of the integrated circuit die proximate to the probe target; and
    depositing a probe pad over the insulating layer proximate to the probe target, the probe pad coupled to the probe target.

2. The method of claim 1 including the additional step of thinning the integrated circuit die from the back side of the integrated circuit die, the thinning step performed before the exposing step.

3. The method of claim 2 wherein the thinning step includes the steps of:
    globally thinning the back side of the integrated circuit die; and
    locally thinning an area of the substrate from the back side of the integrated die proximate to the probe target.

4. The method of claim 3 wherein the step of globally thinning the back side of the integrated circuit die comprises the step of mechanically polishing the back side of the integrated circuit die to globally thin the integrated circuit die.

5. The method of claim 3 wherein the step of globally thinning the back side of the integrated circuit die comprises the step of mechanically machining the back side of the integrated circuit die to globally thin the integrated circuit die.

6. The method of claim 3 wherein the step of globally thinning the back side of the integrated circuit die comprises the step of chemically etching the back side of the integrated circuit die to globally thin the integrated circuit die.

7. The method of claim 3 wherein the step of locally thinning areas of the substrate from the back side of the integrated die proximate to the probe target is performed with a focused ion beam etching tool.

8. The method of claim 1 wherein the step of forming the insulating layer over the substrate includes the steps of:
    locally forming the insulating layer over the back side of the integrated circuit die proximate to and over the probe target; and
    re-exposing the probe target through the insulating layer.

9. The method of claim 8 wherein the step of locally forming the insulating layer is performed using a focused ion beam induced chemical vapor deposition system.

10. The method of claim 8 wherein the step of locally forming the insulating layer is performed using a laser induced chemical vapor deposition system.

11. The method of claim 8 wherein the step of locally forming the insulating layer is performed using an electron beam induced chemical vapor deposition system.

12. The method of claim 8 wherein the step of locally forming the insulating layer is performed using laser induced silicon oxide growth.

13. The method of claim 1 wherein the step of forming the insulating layer over the substrate includes the steps of:
   globally forming the insulating layer over the back side of the integrated circuit die proximate to and over the probe target; and
   re-exposing the probe target through the insulating layer.

14. The method of claim 13 wherein the step of globally forming the insulating layer is performed using a plasma enhanced chemical vapor deposition system.

15. The method of claim 13 wherein the step of globally forming the insulating layer is performed using a dielectric film evaporator.

16. The method of claim 13 wherein the step of globally forming the insulating layer is performed by sputtering deposition.

17. The method of claim 13 wherein the step of globally forming the insulating layer is performed by thermally growing the oxide.

18. The method of claim 1 wherein the step of depositing the conductor is performed using a focused ion beam metal chemical vapor deposition system.

19. The method of claim 1 wherein the step of depositing the conductor is performed using a laser metal chemical vapor deposition system.

20. The method of claim 1 wherein the step of depositing the conductor is performed using an electron beam metal chemical vapor deposition system.

21. In an integrated circuit die, a mechanical probe structure, comprising:
   a probe target accessed from a back side of the integrated circuit die through a substrate of the integrated circuit die;
   an insulating layer formed over the probe target and deposited proximate to the probe target over the substrate of the integrated circuit die from the back side of the integrated circuit die; and
   a probe pad coupled to the probe target through the insulating layer, the probe pad deposited over the insulating layer proximate to the probe target over the substrate of the integrated circuit die.

22. The mechanical probe of claim 16 wherein the back side of the integrated circuit die comprises a trench, the trench including the probe target and the insulating layer formed over the probe target.

23. The mechanical probe of claim 16 wherein the probe pad has dimensions of at least five microns by five microns.

* * * * *